(12) United States Patent
Kwon

(10) Patent No.: US 12,381,140 B2
(45) Date of Patent: Aug. 5, 2025

(54) SEMICONDUCTOR PACKAGE

(71) Applicant: Samsung Electronics Co., Ltd., Suwon-si (KR)

(72) Inventor: Jinmo Kwon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 519 days.

(21) Appl. No.: 17/933,272

(22) Filed: Sep. 19, 2022

(65) Prior Publication Data
US 2023/0215791 A1     Jul. 6, 2023

(30) Foreign Application Priority Data

Dec. 31, 2021   (KR) .................. 10-2021-0193825

(51) Int. Cl.
*H01L 23/498* (2006.01)
*H01L 23/00* (2006.01)
*H01L 23/31* (2006.01)

(52) U.S. Cl.
CPC .... *H01L 23/49822* (2013.01); *H01L 23/3128* (2013.01); *H01L 23/49816* (2013.01);
(Continued)

(58) Field of Classification Search
CPC .......... H01L 23/49822; H01L 23/3128; H01L 23/49816; H01L 23/49827; H01L 23/49838; H01L 24/16; H01L 24/48; H01L 24/05; H01L 24/13; H01L 24/32; H01L 24/45; H01L 24/73; H01L 24/81; H01L 24/85; H01L 2224/16227; H01L 2224/32225; H01L 2224/48227; H01L 2224/73265; H01L 24/83; H01L 21/561; H01L 24/97; H01L 24/09;
(Continued)

(56) References Cited

U.S. PATENT DOCUMENTS 6,400,010 B1   6/2002  Murata
6,486,052 B1  11/2002  Sato
(Continued)

FOREIGN PATENT DOCUMENTS

JP    H0992967 A     4/1997
JP    2007266492 A  10/2007
(Continued)

*Primary Examiner* — Douglas W Owens
(74) *Attorney, Agent, or Firm* — Myers Bigel, P.A.

(57) ABSTRACT

A semiconductor package includes: a substrate including an insulating layer, a plurality of pads on the insulating layer, a surface protective layer covering the insulating layer and having first through-holes exposing at least a portion of the insulating layer and second through-holes exposing at least a portion of each of the plurality of pads, a plurality of first dummy patterns extending from the plurality of pads to the first through-holes, and a plurality of second dummy patterns extending from the first through-holes to an edge of the insulating layer; a semiconductor chip on the substrate and including connection terminals electrically connected to the plurality of pads exposed through the second through-holes; and an encapsulant encapsulating at least a portion of the semiconductor chip and filling the first through-holes, wherein a separation distance between the first through-holes is greater than a separation distance between the second through-holes.

20 Claims, 17 Drawing Sheets

(52) U.S. Cl.
CPC .. *H01L 23/49827* (2013.01); *H01L 23/49838* (2013.01); *H01L 24/16* (2013.01); *H01L 24/48* (2013.01); *H01L 24/05* (2013.01); *H01L 24/13* (2013.01); *H01L 24/32* (2013.01); *H01L 24/45* (2013.01); *H01L 24/73* (2013.01); *H01L 24/81* (2013.01); *H01L 24/85* (2013.01); *H01L 2224/05611* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/1312* (2013.01); *H01L 2224/13139* (2013.01); *H01L 2224/13147* (2013.01); *H01L 2224/16227* (2013.01); *H01L 2224/32225* (2013.01); *H01L 2224/45116* (2013.01); *H01L 2224/45124* (2013.01); *H01L 2224/45139* (2013.01); *H01L 2224/45144* (2013.01); *H01L 2224/45147* (2013.01); *H01L 2224/48227* (2013.01); *H01L 2224/73265* (2013.01); *H01L 2224/81411* (2013.01); *H01L 2224/81416* (2013.01); *H01L 2224/81444* (2013.01); *H01L 2224/81455* (2013.01); *H01L 2224/85411* (2013.01); *H01L 2224/85416* (2013.01); *H01L 2224/85444* (2013.01); *H01L 2224/85455* (2013.01)

(58) Field of Classification Search
CPC . H01L 2224/05073; H01L 2224/05573; H01L 2224/09515
See application file for complete search history.

(56) References Cited

U.S. PATENT DOCUMENTS

| | | |
|---|---|---|
| 2005/0282314 A1 | 12/2005 | Lo et al. |
| 2017/0194240 A1* | 7/2017 | Park ................. H01L 23/49838 |
| 2019/0237398 A1 | 8/2019 | Yu et al. |
| 2021/0183756 A1* | 6/2021 | Chae ..................... H01L 21/56 |
| 2025/0112217 A1* | 4/2025 | Lin ..................... H01L 23/3128 |

FOREIGN PATENT DOCUMENTS

| KR | 19990072580 A | 9/1999 |
|---|---|---|
| KR | 100932429 B1 | 12/2009 |

* cited by examiner

SEMICONDUCTOR PACKAGE

CROSS-REFERENCE TO RELATED APPLICATION

This application claims the priority and benefit of Korean Patent Application No. 10-2021-0193825, filed on Dec. 31, 2021, with the Korean Intellectual Property Office, the disclosure of which is incorporated herein by reference in its entirety.

BACKGROUND

The present inventive concept relates to a semiconductor package.

Pads of a substrate exposed externally may be easily discolored and oxidized, and in order to prevent this, the pads of the substrate may be surface-treated with electrolytic plating or the like. In order to electrically isolate the pads after surface treatment, a portion of plating lines connected to each of the pads may be removed. A region from which the plating line is removed may limit a formation region of an interconnection line connected to the pads for signal transmission.

SUMMARY

An aspect of the present inventive concept is to provide a semiconductor package in which a degree of freedom in designing an interconnection pattern is improved.

According to an aspect of the present inventive concept, a semiconductor package includes: a substrate including an insulating layer, a plurality of pads on the insulating layer, a surface protective layer covering the insulating layer and having first through-holes exposing at least a portion of the insulating layer and second through-holes exposing at least a portion of each of the plurality of pads, a plurality of first dummy patterns extending from the plurality of pads to the first through-holes, and a plurality of second dummy patterns extending from the first through-holes to an edge of the insulating layer; a semiconductor chip on the substrate, and including connection terminals electrically connected to the plurality of pads exposed through the second through-holes; and an encapsulant encapsulating at least a portion of the semiconductor chip and filling the first through-holes, wherein a separation distance between adjacent ones of the first through-holes is greater than a separation distance between adjacent ones of the second through-holes.

According to an aspect of the present inventive concept, a semiconductor package includes: a substrate including a plurality of pads, a surface protective layer having first through-holes and second through-holes spaced apart from the first through-holes and exposing at least a portion of each of the plurality of pads, a plurality of first dummy patterns extending from the plurality of pads to one side of the first through-holes, the plurality of first dummy patterns including first cut surfaces adjacent a sidewall of each of the first through-holes, and a plurality of second dummy patterns extending from another side of the first through-holes, the plurality of second dummy patterns having second cut surfaces adjacent the sidewall of each of the first through-holes; a semiconductor chip on the substrate and including connection terminals electrically connected to the plurality of pads exposed through the second through-holes; and connection bumps below the substrate and electrically connected to the plurality of pads, wherein, in the sidewall of each of the first through-holes, a number of first cut surfaces is greater than a number of second cut surfaces.

According to an aspect of the present inventive concept, a semiconductor package includes: a substrate including a plurality of pads, a surface protective layer having first through-holes and second through-holes spaced apart from the first through-holes and exposing at least a portion of each of the plurality of pads, a plurality of first dummy patterns extending from one side of the plurality of pads to a first side of the first through-holes, at least one interconnection pattern extending from at least a portion of the plurality of pads between adjacent ones of the first through-holes, and a plurality of second dummy patterns extending from a second side of the first through-holes; and a semiconductor chip on the substrate and including connection terminals electrically connected to the plurality of pads exposed through the second through-holes.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings as follows.

Figure 1A:
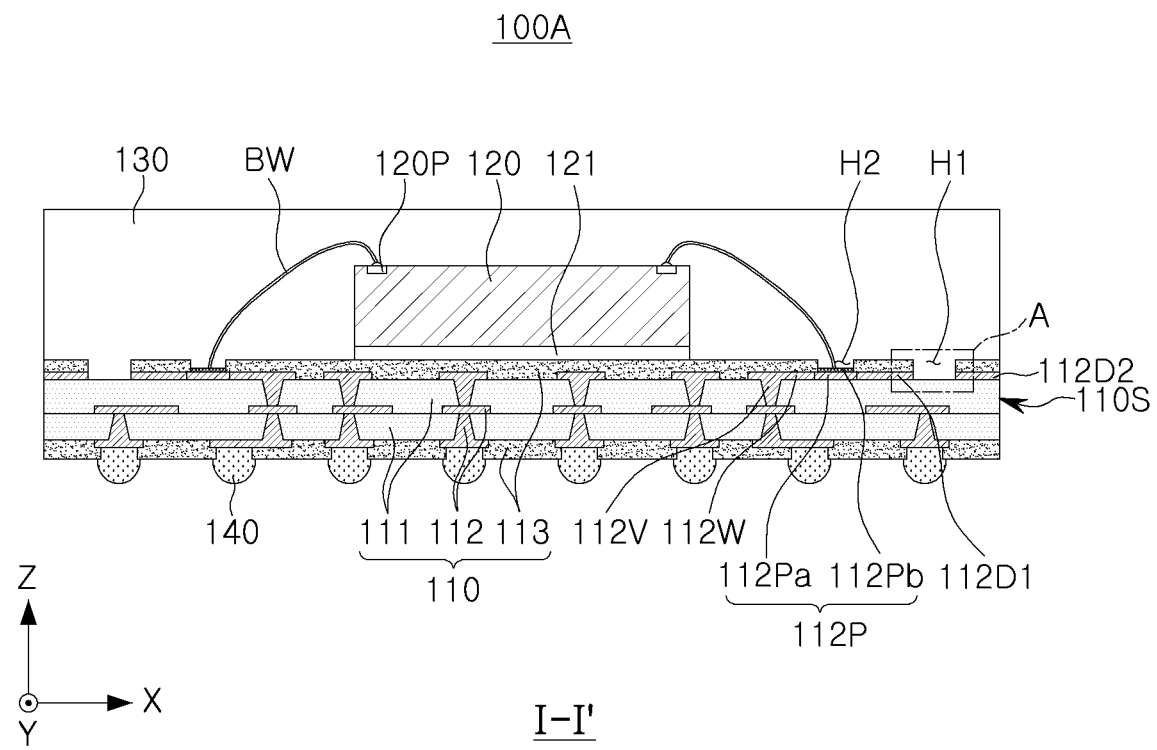
FIG. 1A is a cross-sectional view illustrating a semiconductor package according to an example embodiment of the present inventive concept.
Figure 1B:
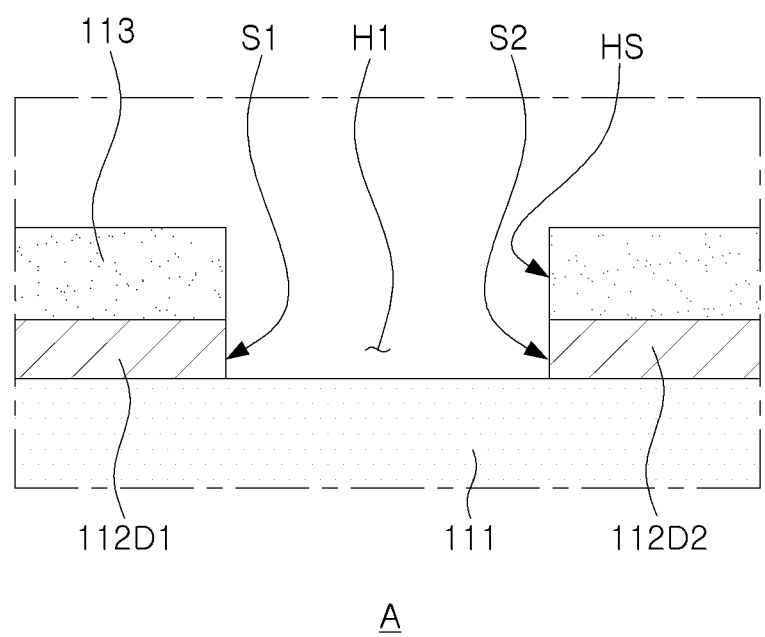
FIG. 1B is a partially enlarged view illustrating region 'A' of FIG. 1A.
Figure 1C:
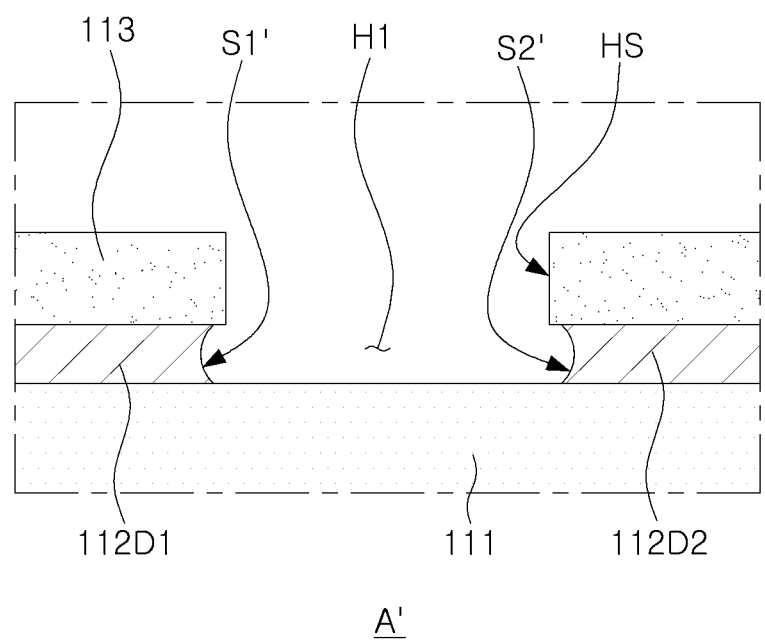
FIG. 1C is a partially enlarged view illustrating a modified example of region 'A' of FIG. 1A.

FIG. 1A is a cross-sectional view illustrating a semiconductor package 100A according to an example embodiment of the present inventive concept, FIG. 1B is a partially enlarged view illustrating region 'A' of FIG. 1A, and FIG. 1C is a partially enlarged view illustrating a modified example of region 'A' of FIG. 1A.

Referring to FIGS. 1A to 1C, the semiconductor package 100A of an example embodiment may include a substrate 110, a semiconductor chip 120, an encapsulant 130, and a connection bump 140.

The substrate 110 may include an insulating layer 111, an interconnection structure 112, and a surface protective layer 113. The insulating layer 111 may include an insulating material capable of electrically and physically protecting the interconnection structure 112. The insulating material may include a thermosetting resin such as an epoxy resin, a thermoplastic resin such as polyimide, or a resin impregnated with inorganic fillers or/and glass fibers (Glass Fiber, Glass Cloth, Glass Fabric) in these resins, for example, prepreg, Ajinomoto Build-up Film (ABF), FR-4, Bismaleimide Triazine (BT) or Photoimageable Dielectric (PID). The insulating layer 111 may have a form in which one or more insulating material layers are stacked in a vertical direction (Z-axis direction). For example, the insulating layer 111 may include fewer or more layers than shown in the drawings. Depending on the process, a boundary between a plurality of insulating layers 111 may be unclear.

The interconnection structure 112 may provide an electrical path connecting the semiconductor chip 120 and the connection bumps 140 in the insulating layer 111. For example, the interconnection structure 112 may include interconnection patterns 112W and interconnection vias 112V providing a transmission path for a power signal, a data signal, a ground signal, and the like. The interconnection structure 112 may include, for example, copper (Cu), aluminum (Al), silver (Ag), tin (Sn), gold (Au), nickel (Ni), lead (Pb), titanium (Ti), or a metal material including alloys thereof. The interconnection structure 112 may include a plurality of pads 112P disposed on top of the insulating layer 111.

The plurality of pads 112P may be exposed from or by the surface protective layer 113 in order to be connected to the connection terminal 120P of the semiconductor chip 120. The plurality of pads 112P may include a body layer 112Pa disposed on the insulating layer 111 and a surface plating layer 112Pb disposed on the body layer 112Pa. The surface plating layer 112Pb may be formed in a form of a thin film on the body layer 112Pa. For example, a thickness of the body layer 112Pa may be in a range of about 1 μm to about 10 μm, and a thickness of the surface plating layer 112Pb may be in a range of about 0.1 μm to about 1 μm. However, the thicknesses of the body layer 112Pa and the surface plating layer 112Pb are not limited to the above-described numerical ranges. The body layer 112Pa may include, for example, copper (Cu) or an alloy including copper (Cu), and the surface plating layer 112Pb may include at least one of, for example, tin (Sn), lead (Pb), nickel (Ni), and gold (Au). The surface plating layer 112Pb may have a monolayer or multilayer shape. For example, the surface plating layer 112Pb may have a form in which a nickel (Ni) layer and a gold (Au) layer are sequentially stacked on the body layer 112Pa.

Meanwhile, the surface plating layer 112Pb may be formed using an electrolytic plating process. In order to open a short between the plurality of pads 112P after the surface plating layer 112Pb is formed, a portion of the plating patterns used in the electrolytic plating process may be removed. Accordingly, the interconnection structure 112 may include a plurality of first dummy patterns 112D1 and a plurality of second dummy patterns 112D2 from which plating patterns are electrically separated. In the present inventive concept, an area of an etch-back region H1 (hereinafter, 'first through-hole') electrically and physically separating the plurality of first dummy patterns 112D1 and the plurality of second dummy patterns 112D2 may be minimized, so that a routing area of the interconnection pattern 112W on an uppermost surface of the insulating layer 111 may be secured, and a degree of freedom in design of the interconnection structure 112 may be improved. This will be described in more detail with reference to FIGS. 2A and 2B.

The plurality of first dummy patterns 112D1 may have first cut surfaces S1 extending from one side of the plurality of pads to one side of the first through-holes H1, and exposed to a sidewall HS of each of the first through-holes H1. The plurality of second dummy patterns 112D2 may have second cut surfaces S2 extending from the other side of the first through-holes H1, and exposed to a sidewall HS of each of the first through-holes H1. The plurality of second dummy patterns 112D2 may extend to an outer peripheral portion of the insulating layer 111 (or an edge 110S of the substrate 110) through voltage lead lines of an electroplating process. For example, one end of the plurality of second dummy patterns 112D2 may be exposed to a side surface of the substrate 110. As shown in FIG. 1B, the first cut surfaces S1 and the second cut surfaces S2 may be coplanar or substantially coplanar with the sidewalls HS of the first through-holes H1. According to an example embodiment, the first cut surfaces S1' and the second cut surfaces S2' may have a step difference from the sidewall HS of the first through-holes H1. As illustrated in FIG. 1C, in a modified example, the first cut surfaces S1' and the second cut surfaces S2' may be located further inside than the sidewalls HS of the first through-holes H1. The first cut surfaces S1' and the second cut surfaces S2' may be concave.

The surface protective layer 113 may be formed to cover upper and lower surfaces of the insulating layer 111, to protect the interconnection structure 112 from external physical/chemical damage. The surface protective layer 113 may be formed using, for example, prepreg, ABF, FR-4, BT, solder resist (SR), or photo solder resist (PSR). The surface protective layer 113 may have first through-holes H1 exposing at least a portion of the insulating layer 111 and second through-holes H2 spaced apart from the first through-holes H1 and exposing at least a portion of each of the plurality of pads 112P. The second through-holes H2 may expose the plurality of pads 112P for connection of the semiconductor chip 120. The first through-holes H1 may be etch-back regions in which connection points of plating patterns extending from the plurality of pads 112P toward an edge of the substrate 110 are removed. Accordingly, the first through-holes H1 may be disposed more adjacently or closer to a side surface or edge 110S of the substrate 110 than the second through-holes H2. In addition, in the first through-holes H1, at least one plurality of first dummy patterns 112D1 and at least one plurality of second dummy patterns 112D2 may be physically and electrically spaced apart from each other. The first through-holes H1 may have a circular or polygonal shape on a plane (X-Y plane). According to the present inventive concept, the first through-holes H1 may have a shape of preventing interference between the plurality of first dummy patterns 112D1 and the plurality of second dummy patterns 112D2, spaced apart from each other, but minimizing an area thereof. Accordingly, a routing region of the interconnection pattern 112W may be secured, and a degree of freedom in design of the interconnection structure 112 may be improved. For example, the shape of the first through-holes H1 may be a polygon having sides of substantially the same length. This will be described below with reference to FIGS. 3A to 3D.

The semiconductor chip 120 may be disposed on the substrate 110, and include connection terminals 120P electrically connected to the plurality of pads 112P exposed through the second through-holes H2. The connection terminals 120P may be connection pads of a bare chip or additionally formed bump pads. The connection terminals 120P may include, for example, copper (Cu), aluminum (Al), silver (Ag), tin (Sn), gold (Au), nickel (Ni), lead (Pb), or titanium (Ti), or a metal material including alloys thereof. In an example embodiment, the connection terminals 120P may be electrically and physically connected to the plurality of pads 112P through a bonding wire BW (or 'conductive wire'). The bonding wire BW may include gold (Au), silver (Ag), lead (Pb), aluminum (Al), copper (Cu), or alloys thereof, but an example embodiment thereof is not limited thereto. The semiconductor chip 120 may be attached to the substrate 110 by an adhesive film 121 such as a die attach film (DAF).

The semiconductor chip 120 may be or include, for example, a logic chip such as a central processor (e.g., CPU), a graphics processor (e.g., GPU), a field programmable gate array (FPGA), a digital signal processor, a cryptographic processor, a microprocessor, a microcontroller, an analog-to-digital converter, an application-specific IC (ASIC), and a Serializer and Deserializer IC (SerDes IC) including a high-speed serial-to-parallel conversion circuit, a volatile memory chip such as dynamic RAM (DRAM), static RAM (SRAM), or the like, and a non-volatile memory chip such as a phase change RAM (PRAM), a magnetic RAM (MRAM), a resistive RAM (RRAM), a flash memory, and the like.

The encapsulant 130 may encapsulate at least a portion of the semiconductor chip 120, and fill the first through-holes H1. The encapsulant 130 may include, for example, a thermosetting resin such as an epoxy resin, a thermoplastic resin such as polyimide, or a prepreg including an inorganic filler and/or a glass fiber, Ajinomoto Build-up Film (ABF), FR-4, Bismaleimide Triazine (BT), an Epoxy Molding Compound (EMC), and the like.

The connection bump 140 may be disposed below the substrate 110, and may be electrically connected to the plurality of pads 112P through the interconnection structure 112. The connection bump 140 may physically and/or electrically connect the semiconductor package 100A to an external device. The connection bump 140 may include a conductive material, and may have a form of a ball, a pin, or a lead. For example, the connection bump 140 may have a spherical or ball shape made of a low-melting-point metal such as tin (Sn), indium (In), bismuth (Bi), antimony (Sb), copper (Cu), silver (Ag), zinc (Zn), lead (Pb), an alloy (eg, Sn—Ag—Cu) including the same.

Hereinafter, a dispositional or positional relationship between first through-holes H1 and a plurality of first and second dummy patterns 112D1 and 112D2 on an X-Y plane will be described with reference to FIGS. 2A and 2B.

Figure 2A:
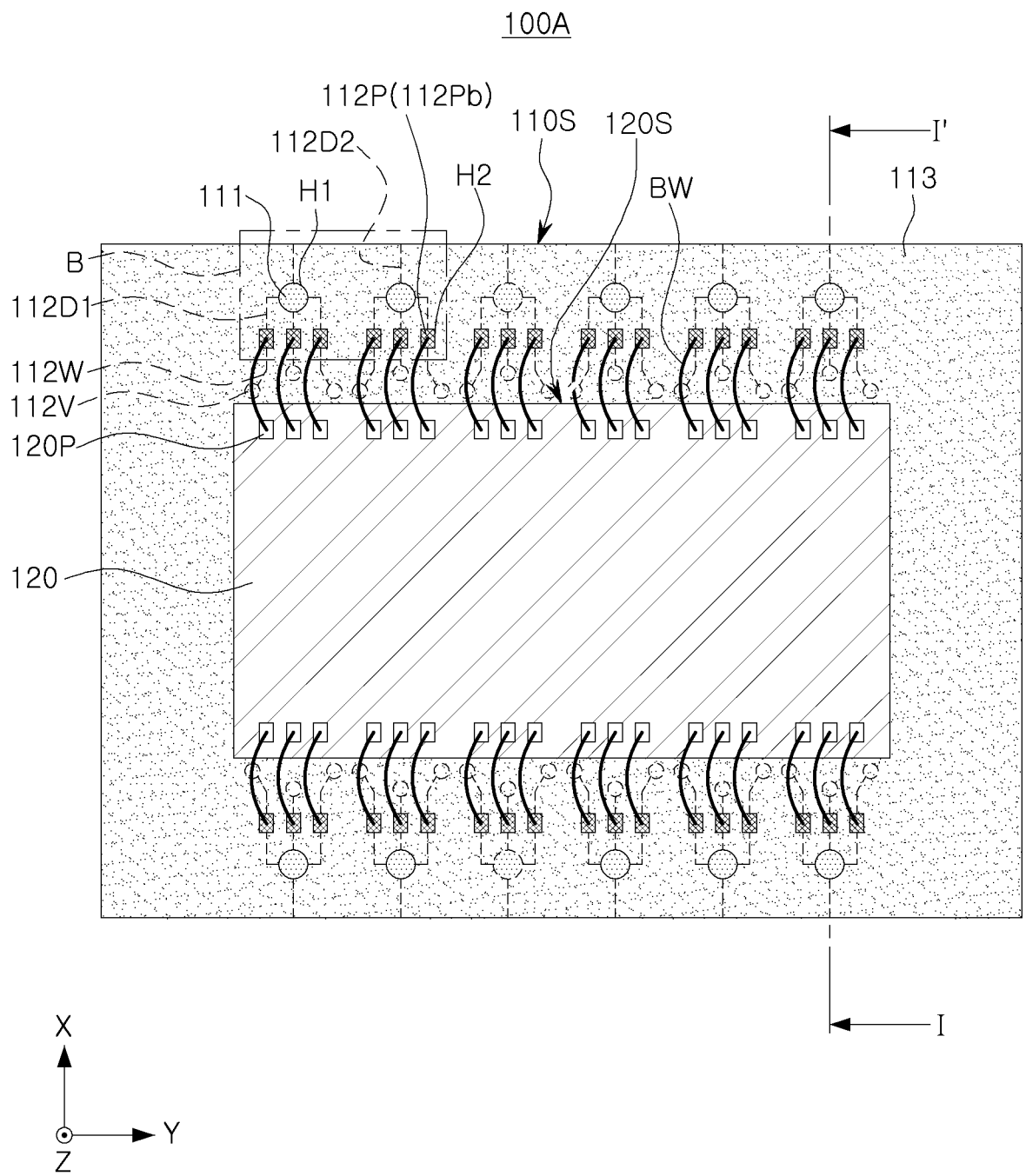
FIG. 2A is a plan view illustrating the semiconductor package of FIG. 1A.
Figure 2B:
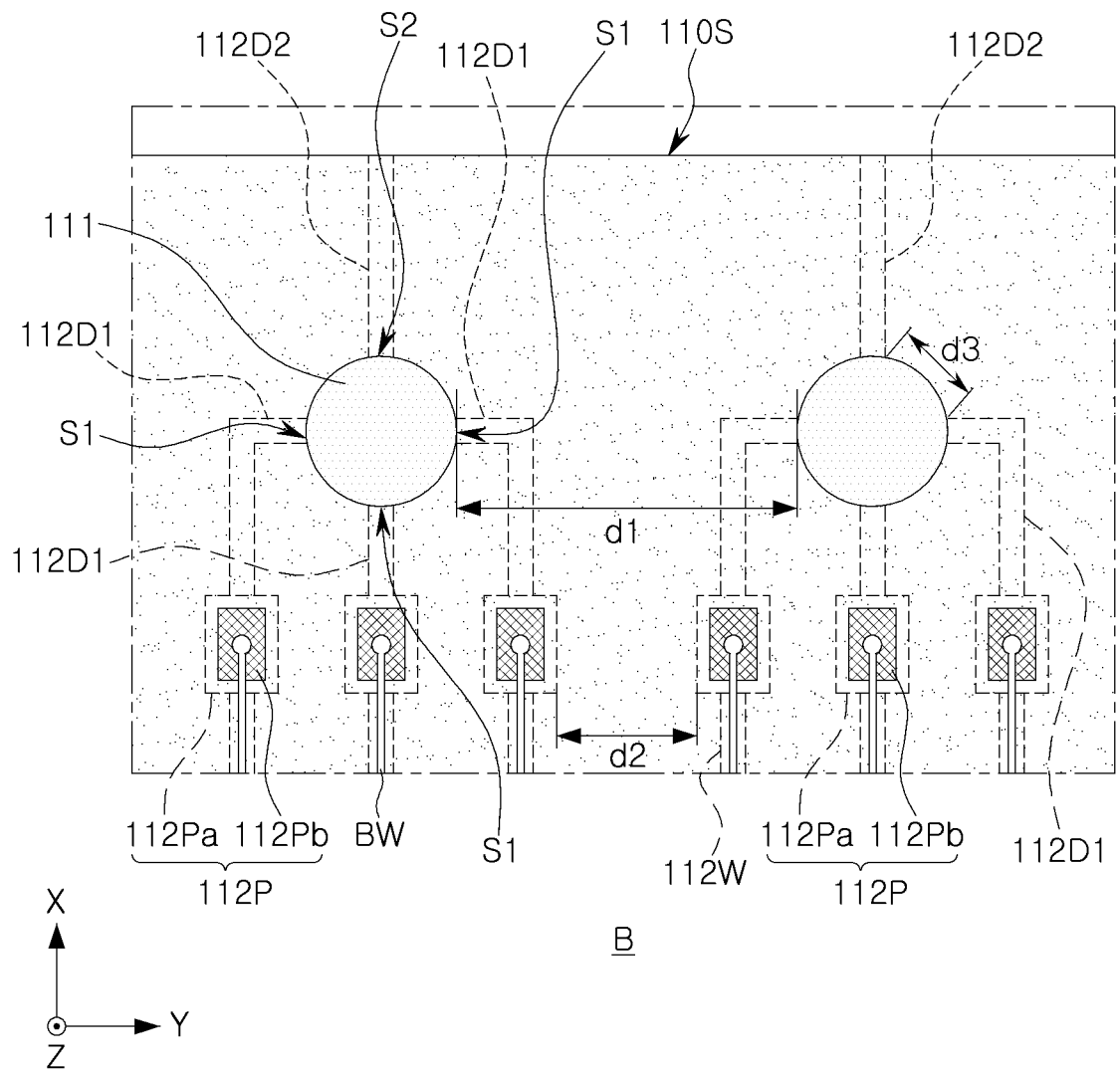
FIG. 2B is a partially enlarged view illustrating region 'B' of FIG. 2A.

FIG. 2A is a plan view illustrating a semiconductor package 100A according to an example embodiment of the present inventive concept, and FIG. 2B is a partially enlarged view illustrating region 'B' of FIG. 2A. FIG. 2A illustrates a dispositional or positional relationship between first and second through-holes H1 and H2 and a plurality of first and second dummy patterns 112D1 and 112D2, having the encapsulant 130 of FIG. 1A omitted therefrom. FIG. 1A illustrates a cross-section corresponding to the line I-I' of FIG. 2A.

Referring to FIGS. 2A and 2B, a semiconductor package 100A according to an example embodiment may include a plurality of pads 112P, adjacent to an edge 120S of the semiconductor chip 120 and a plurality of first through-holes H1 positioned adjacent to an edge or the substrate 110 or between the edge 110S of the substrate 110 and the edge 120S of the semiconductor chip 120. According to the present inventive concept, by minimizing an area of the first through-holes H1, it is possible to secure a routing area of an interconnection pattern 112W and improve a degree of freedom in design. To this end, the first through-holes H1 may be formed at a point at which an extension line of each of the at least one second dummy pattern 112D2 and the at least one first dummy pattern 112D1 intersects. For example, each of the first through-holes H1 may be formed at a point at which an extension line of each of one second dummy pattern 112D2 and two or more first dummy patterns 112D1 intersects, so that the first through-holes H1 may be separated by a predetermined distance, and accordingly, a routing space of the interconnection pattern 112W may be secured between the first through-holes H1. For example, a first separation distance d1 between the first through-holes H1 may be greater than a second separation distance d2 between the second through-holes H2. The first separation distance d1 may be in a range of about 200 μm or more, for example, about 200 μm to about 1000 μm, about 200 μm to about 800 μm, or about 200 μm to about 500 μm. This means that a space for forming the wiring pattern 112W can be secured between the first through-holes H1, and the first separation distance d1 between the first through-holes H1 is not limited to the above-described numerical range.

In addition, the number of first cut surfaces S1 exposed through a sidewall HS of each of the first through-holes H1 may be greater than the number of second cut surfaces S2. For example, in the sidewall HS of each of the first through-holes H1, the number of the first cut surfaces S1 may be two or more, and the number of the second cut surfaces S2 may be one. In each of the first through-holes H1, the plurality of first dummy patterns 112D1 and the plurality of second dummy patterns 112D2 may contact the encapsulant 130. Two or more first dummy patterns 112D1 and one second dummy pattern 112D2 corresponding to each of the first through-holes H1 may be electrically insulated from each other. For example, a third separation distance d3 between two or more first dummy patterns 112D1 and one second dummy pattern 112D2 in each of the first through-holes H1 may be about 50 μm. or more, from about 50 μm to about 300 μm, from about 50 μm to about 200 μm, from about 50 μm to about 150 μm, or from about 50 μm to about 100 μm. When the third separation distance d3 is less than about 50 μm, interference may occur between the adjacent first dummy patterns 112D1 and the second dummy patterns 112D2. When the third separation distance d3 exceeds about 300 μm, it may be difficult to minimize the area of the first through-holes H.

As described above, since the first through-holes H1 correspond to a plurality of (two or more) the first dummy patterns 112D1 and one second dummy pattern 112D2, the first through-holes H1 may be spaced apart by a predetermined distance, and a routing space may be secured between the first through-holes H1.

Hereinafter, exemplary planar shapes of the first through-holes H1 will be described with reference to FIGS. 3A to 3D.

FIGS. 3A to 3D are partially enlarged views respectively illustrating a modified example of a planar shape of first through-holes H1. FIGS. 3A to 3D illustrate the planar shape of the first through-holes H1 capable of securing a third separation distance d3 between a plurality of (two or more) first dummy patterns 112D1 and one second dummy pattern 112D2, and minimizing an area thereof.

Figure 3A:
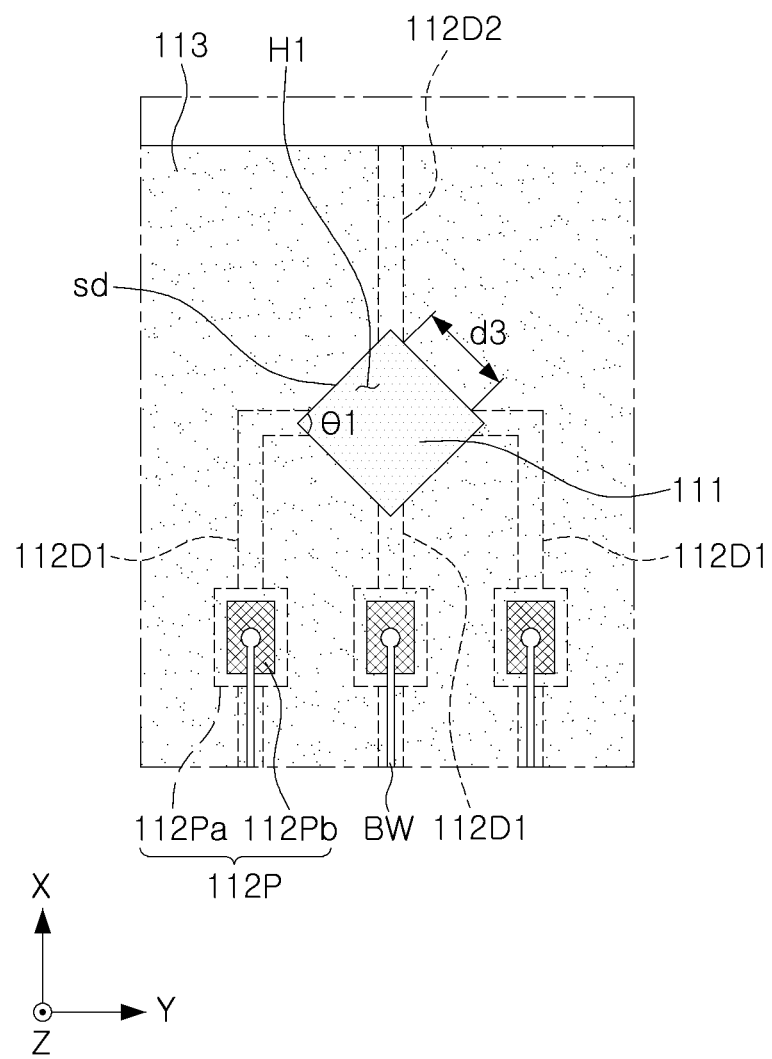
FIGS. 3A to 3D are partially enlarged views respectively illustrating a modified example of a planar shape of first through-holes.

Referring to FIG. 3A, in a modified example, the first through-holes H1 may have a rectangular shape having sides sd of substantially the same length. For example, three first dummy patterns 112D1 and one second dummy pattern 112D2 may correspond to vertices between respective sides sd. Accordingly, the first dummy patterns 112D1 and the second dummy pattern 112D2, adjacent to each other, may be spaced apart from each other by lengths of the respective sides sd. Substantially, the respective sides sd may be formed to have a length sufficient to secure a third separation distance d3 between the first dummy patterns 112D1 and the second dummy pattern 112D2. For example, the first through-holes H1 may have a square shape in which an angle θ1 between the respective sides sd is substantially the same.

Figure 3B:
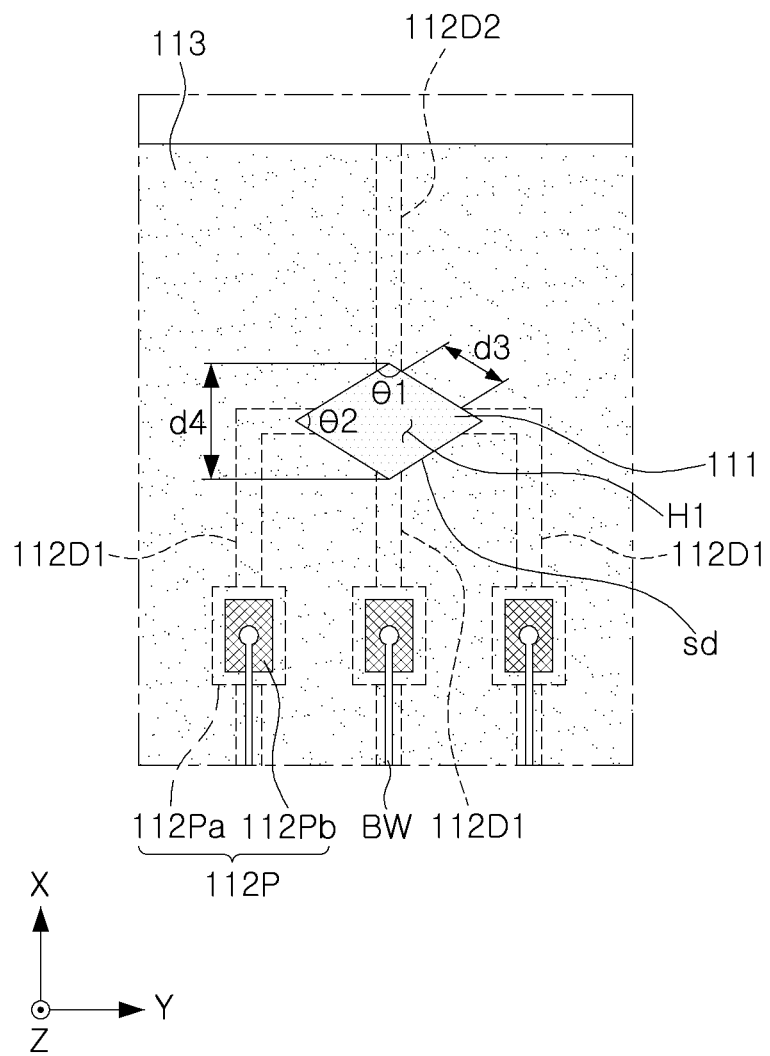

Referring to FIG. 3B, in a modified example, the first through-holes H1 may have a rectangular or rhombus shape in which sides sd of substantially the same length, and a first angle θ1 and a second angle θ2 of vertices, adjacent to each other are different. For example, three first dummy patterns 112D1 and one second dummy pattern 112D2 may correspond to vertices between respective sides sd. Accordingly, the first dummy patterns 112D1 and the second dummy patterns 112D2 adjacent to each other may be spaced apart from each other by the length of the respective sides sd. In addition, at least a portion of the first dummy patterns 112D1 and the second dummy patterns 112D2 facing each other may be spaced apart by a separation distance d4, substantially equal to the distance d3 between the first dummy patterns 112D1 and the second dummy pattern 112D2 positioned at vertices adjacent to each other. Similarly thereto, a planar shape of the first through-holes H1 may be an ellipse according to an example embodiment.

Figure 3C:
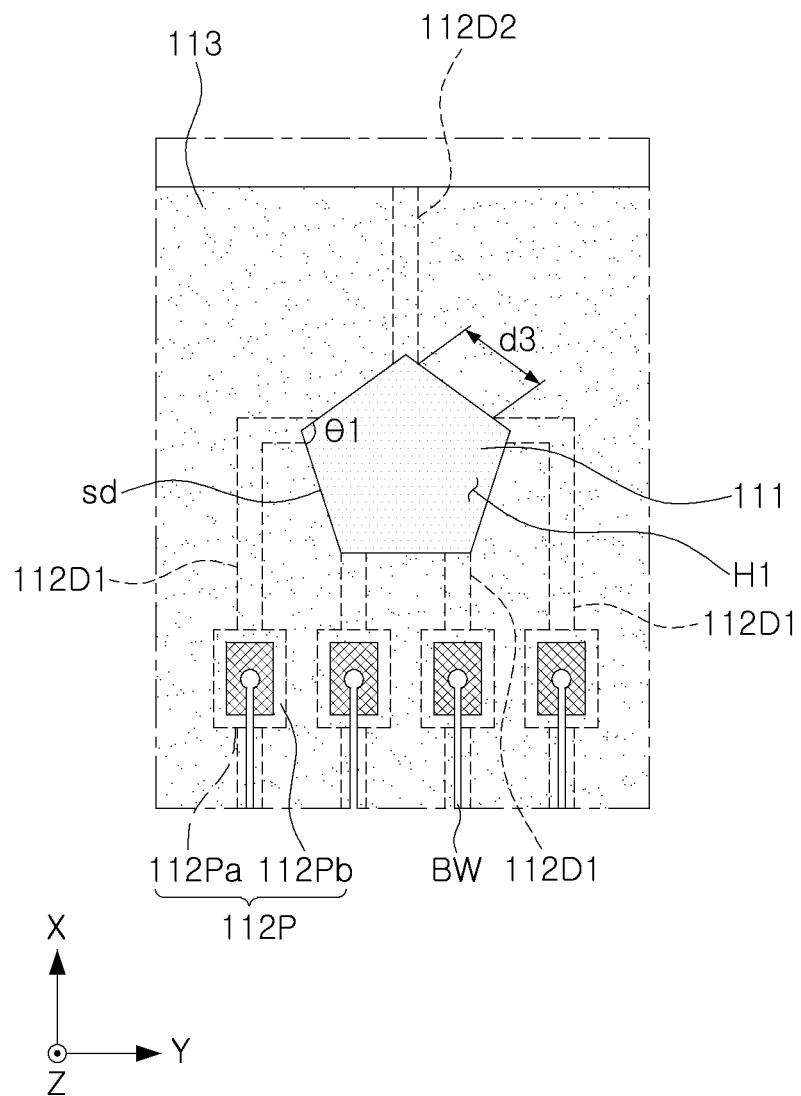

Referring to FIG. 3C, in a modified example, the first through-holes H1 may have a pentagonal shape having sides sd of substantially the same length. For example, four first dummy patterns 112D1 and one second dummy pattern 112D2 may correspond to vertices between respective sides sd. Accordingly, the first dummy patterns 112D1 and the second dummy patterns 112D2, adjacent to each other may be spaced apart from each other by a length of the respective sides sd. Substantially, the respective sides sd may be formed to have a length sufficient to secure a third separation distance d3 between the first dummy patterns 112D1 and the second dummy patterns 112D2. For example, an angle θ1 between the respective sides sd of the first through-holes H1 may be substantially the same, but example embodiments are not limited thereto (see, e.g., FIG. 3B).

Figure 3D:
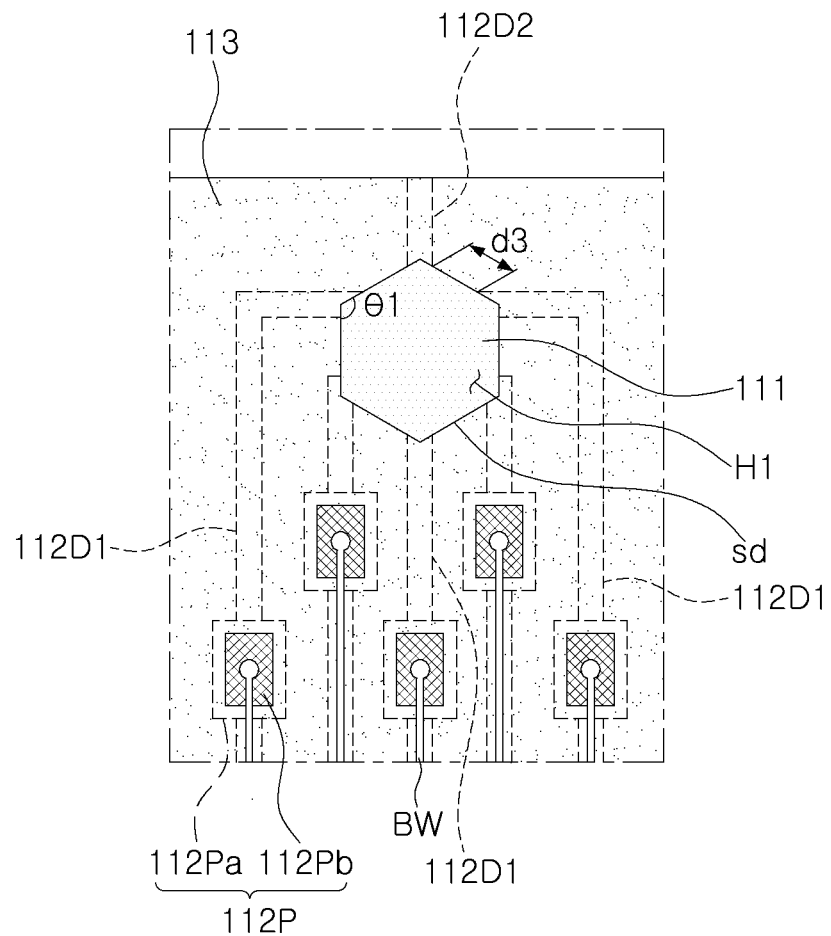

Referring to FIG. 3D, in a modified example, the first through-holes H1 may have a hexagonal shape having sides sd of substantially the same length. For example, five first dummy patterns 112D1 and one second dummy pattern 112D2 may correspond to vertices between the respective sides sd. For example, when the number of first dummy patterns 112D1 extending through the first through-holes H1 increases, the dummy pads 112P corresponding to the first dummy patterns 112D1 may be alternately disposed. The first dummy patterns 112D1 and the second dummy patterns 112D2, adjacent to each other may be spaced apart from each other by the length of the respective sides sd. Substantially, the respective sides sd may be formed to have a length sufficient to secure a third separation distance d3 between the first dummy patterns 112D1 and the second dummy patterns 112D2. For example, an angle θ1 between the respective sides sd of the first through-holes H1 may be substantially the same, but example embodiments are not limited thereto (see, e.g., FIG. 3B).

Figure 4A:
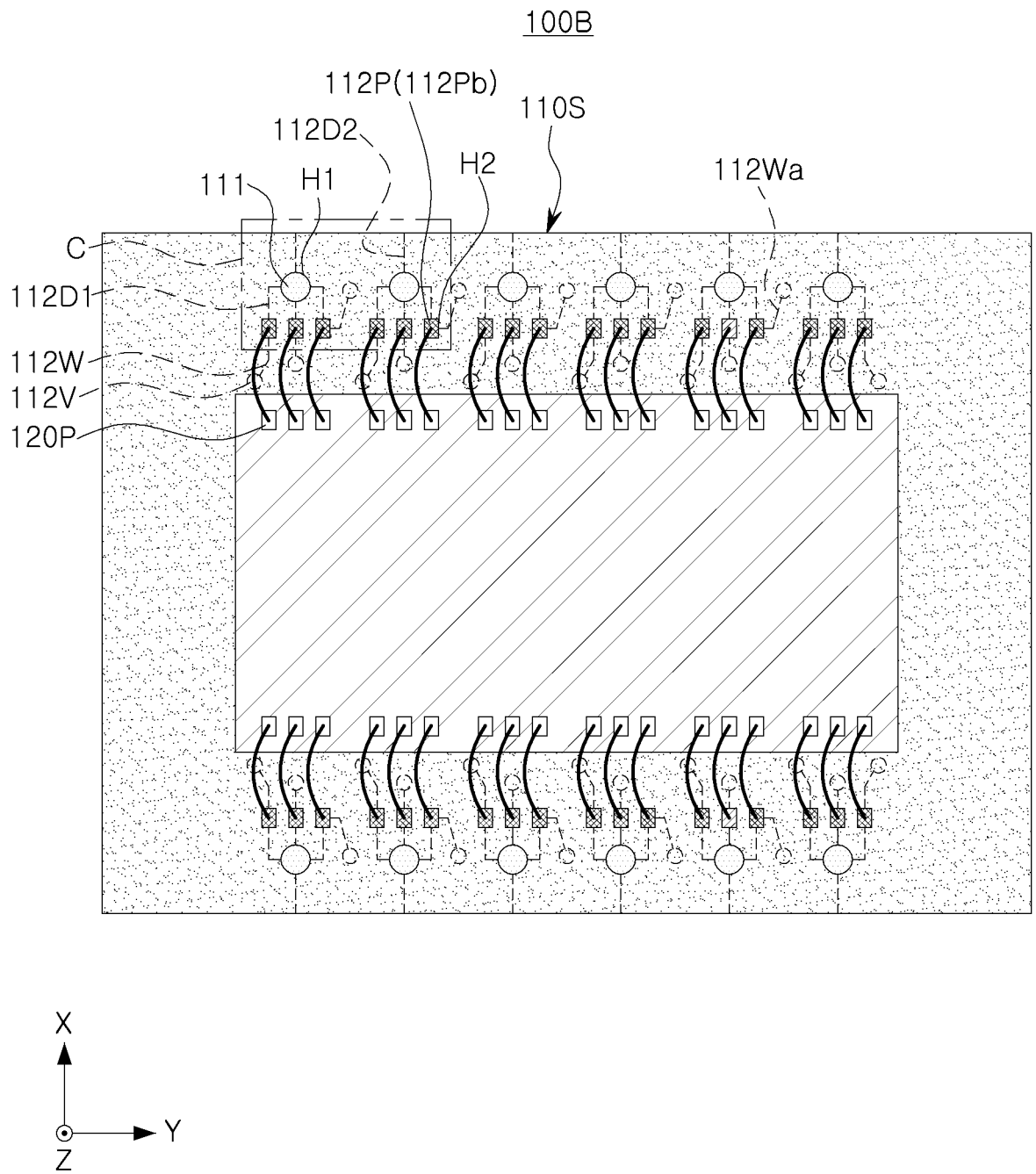
FIG. 4A is a plan view illustrating a semiconductor package according to an example embodiment of the present inventive concept.
Figure 4B:
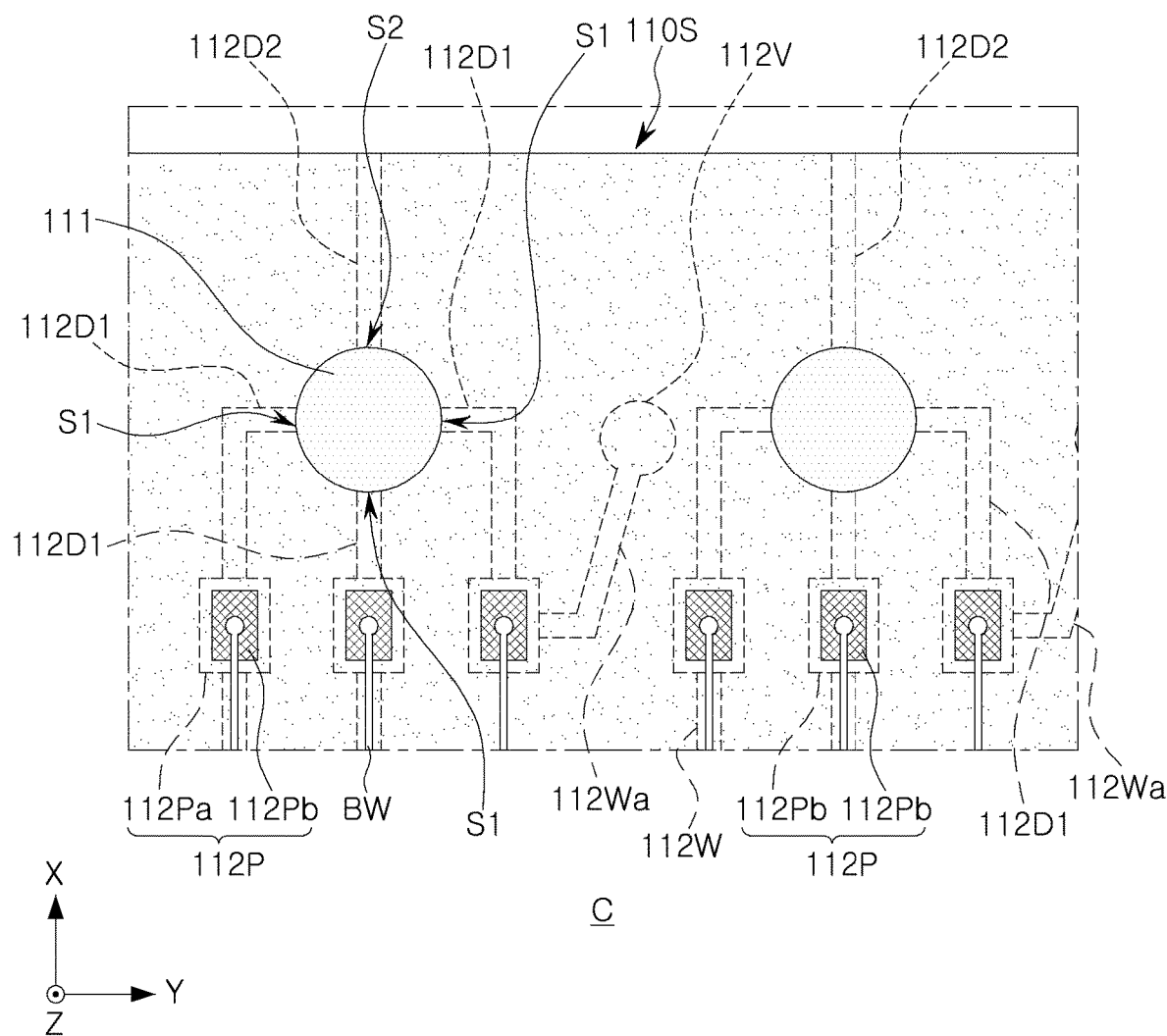
FIG. 4B is a partially enlarged view illustrating region 'C' of FIG. 4A.

FIG. 4A is a plan view illustrating a semiconductor package 100B according to an example embodiment of the present inventive concept, and FIG. 4B is a partially enlarged view illustrating region 'C' of FIG. 4.

Referring to FIGS. 4A and 4B, the semiconductor package 100B of an example embodiment may have the same or similar characteristics as those described with reference to FIGS. 1A to 3D, except for including at least one interconnection pattern 112Wa extending between first through-holes H1 adjacent to each other. In the present example embodiment, the substrate 110 may further include a first dummy pattern 112D1 extending from one side of at least one plurality of pads 112P and at least one interconnection pattern 112Wa extending from another side of the plurality of pads 112P. The at least interconnection pattern 112Wa may be positioned between the first through-holes H1 adjacent to each other on a plane (X-Y plane).

In the present inventive concept, by minimizing an area of the first through-holes H1 cutting the plurality of first and second dummy patterns 112D1 and 112D2, a routing space of an interconnection pattern 112W may be secured between the first through-holes H1. Accordingly, as in the present example embodiment, at least a portion of interconnection patterns 112Wa extending from the plurality of pads 112P may extend between the first through-holes H1.

Figure 5A:
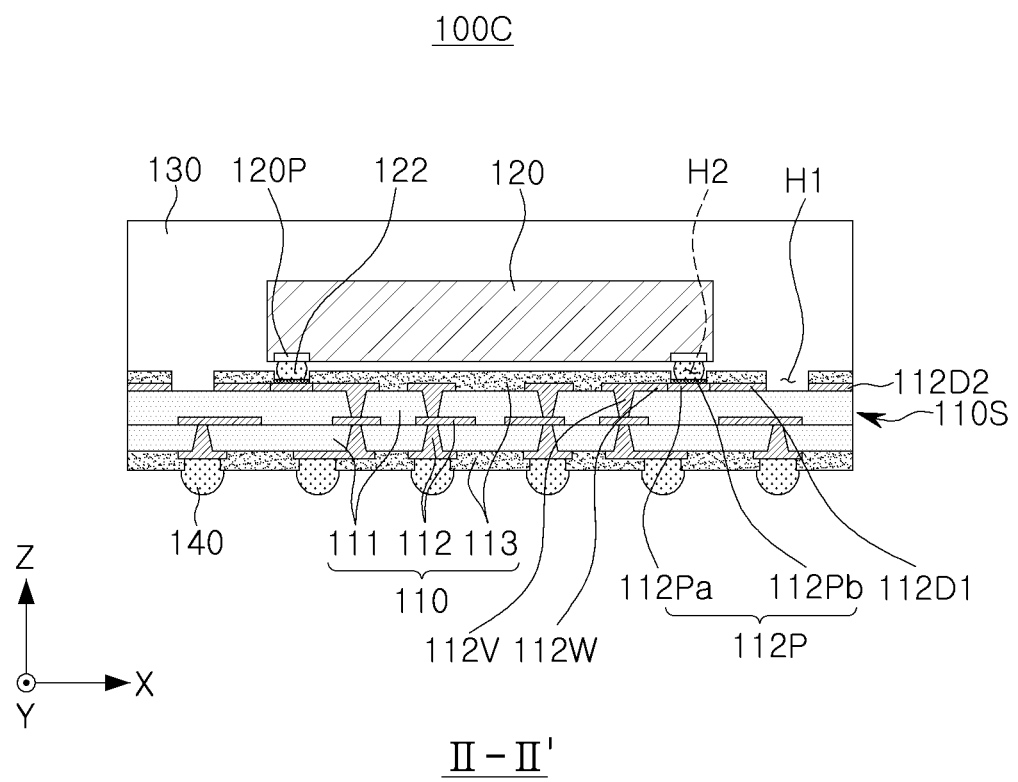
FIG. 5A is a cross-sectional view illustrating a semiconductor package according to an example embodiment of the present inventive concept.
Figure 5B:
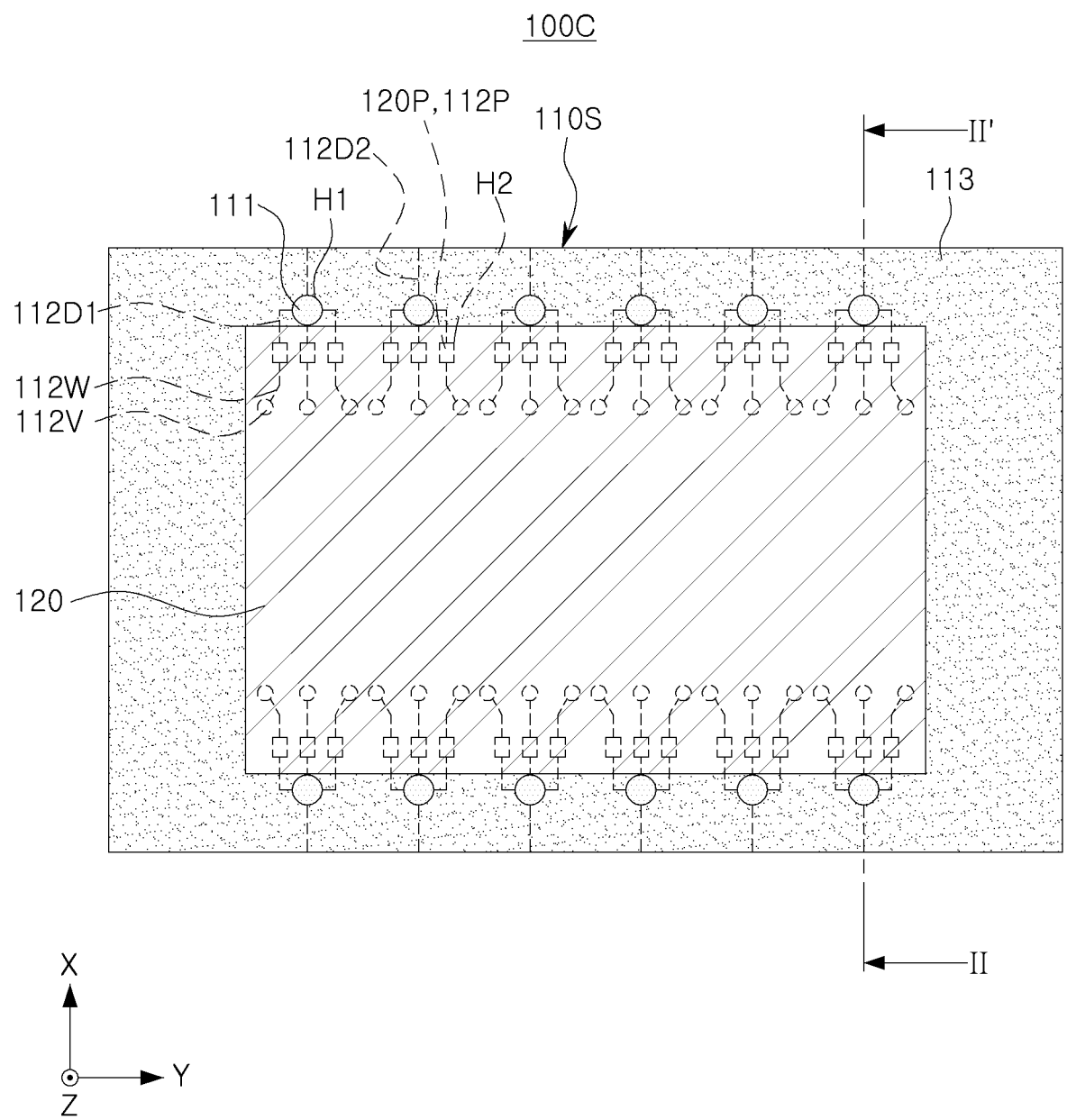
FIG. 5B is a plan view illustrating the semiconductor package of FIG. 5A.

FIG. 5A is a cross-sectional view illustrating a semiconductor package 100C according to an example embodiment of the present inventive concept, and FIG. 5B is a plan view illustrating the semiconductor package 100C of FIG. 5A. FIG. 5B illustrates a dispositional or positional relationship of first and second through-holes H1 and H2 and a plurality of first and second dummy patterns 112D1 and 112D2, having the encapsulant 130 of FIG. 5A omitted therefrom. FIG. 5A illustrates a cross-section corresponding to the line II-II' in FIG. 5B.

Referring to FIGS. 5A and 5B, a semiconductor package 100C according to an example embodiment may have the same or similar characteristics described with reference to FIGS. 1A to 4B, except for including the semiconductor chip 120 mounted on the substrate 110 in a flip-chip manner. In the present example embodiment, the plurality of pads 112P may overlap connection terminals 120P of the semiconductor chip 120 on a plane (X-Y plane), and the connection terminals 120P of the semiconductor chip 120 may be electrically connected to the plurality of pads 112P through connection members 122. The connection members 122 may include, for example, tin (Sn), indium (In), bismuth (Bi), antimony (Sb), copper (Cu), silver (Ag), zinc (Zn), and lead (Pb) or an alloy containing the same (e.g., Sn—Ag—Cu) and may be a conductive bump including a low-melting point metal. Compared to the semiconductor package 100A of FIG. 1A in which the semiconductor chip 120 is mounted in a wire-bonding method, in the present example embodiment, an area of the substrate 110 may be reduced and a degree of integration of the plurality of pads 112P may be further increased. Accordingly, an interconnection pattern 112W may be designed by more effectively utilizing the separation space between the first through-holes H1.

FIGS. 6A to 6D are cross-sectional views illustrating a manufacturing process of a substrate 110 applied to the semiconductor package of an example embodiment according to a process sequence.

Figure 6A:
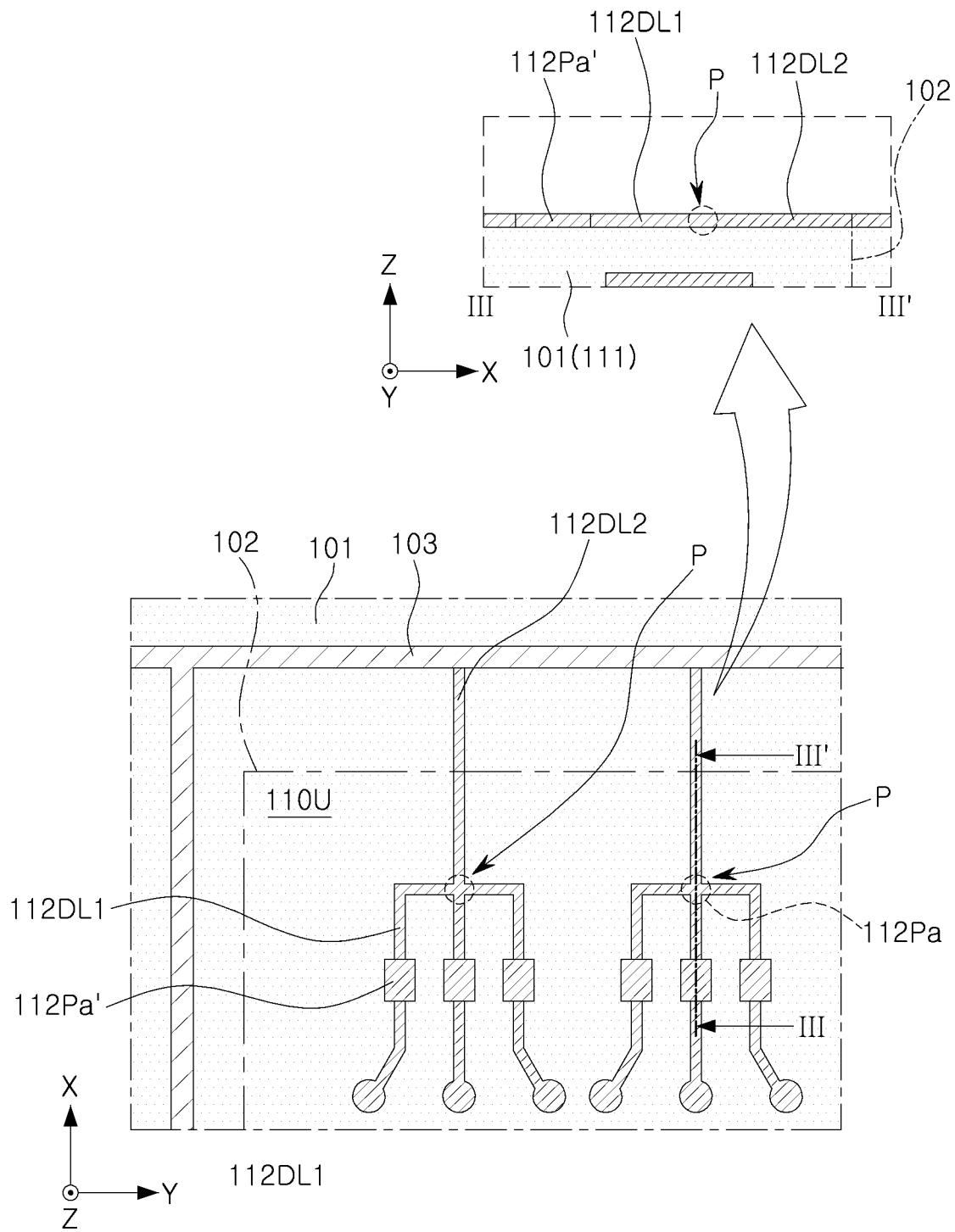
FIGS. 6A to 6D are cross-sectional views illustrating a manufacturing process of a substrate applied to a semiconductor package according to a process sequence according to an example embodiment.

Referring to FIG. 6A, a strip substrate 101 may include at least one unit substrate 110U divided by a substrate outline 102. A plating bar 103, a plurality of preliminary pads 112Pa', a plurality of first plating lines 112DL1, and a plurality of second plating lines 112DL2 may be formed on the strip substrate 101. The strip substrate 101 may be formed of an insulating material layer corresponding to the insulating layer 111 of FIG. 1A. The plating bar 103 may be spaced apart from the substrate outline 102 by a predetermined distance to extend along a circumference of the unit substrate 110U. The plurality of preliminary pads 112Pa' may be formed inside the substrate outline 102, that is, on the unit substrate 110U. The plurality of preliminary pads 112Pa' is a single plating layer on which a plating film is not formed, and may correspond to the body layer 112Pa of FIG. 1A. The plurality of first plating lines 112DL1 may extend from one side of each of the plurality of preliminary pads 112Pa', and at least two first plating lines may make contact therewith at contact points P adjacent to the substrate outline 102. The plurality of second plating lines 112DL2 may extend from the respective contact points P to contact the plating bar 103. Accordingly, the plating bar 103 may be shorted with the plurality of first plating lines 112DL1 and the plurality of second plating lines 112DL2.

Figure 6B:
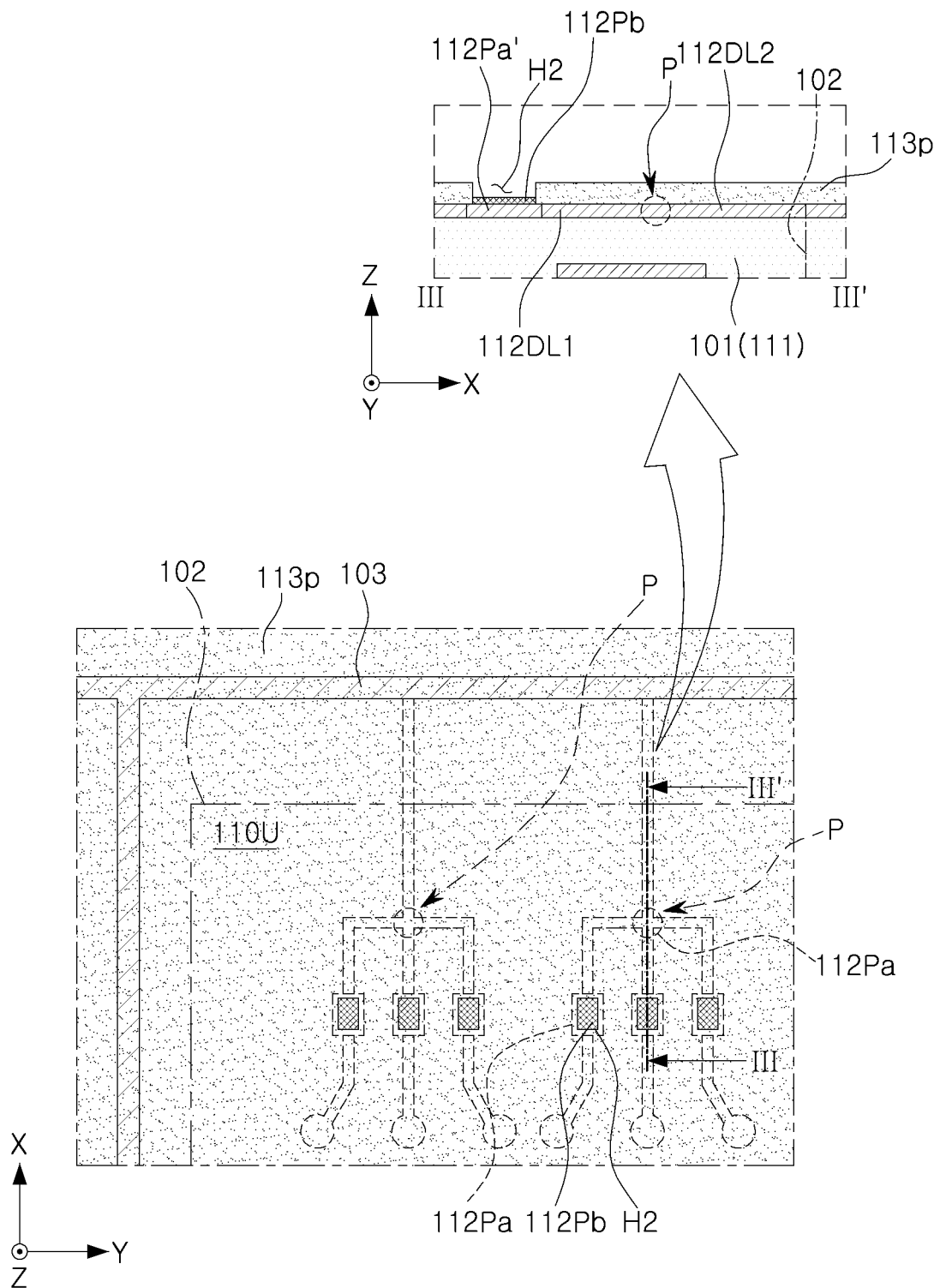

Referring to FIG. 6B, a preliminary surface protective layer 113p having second through-holes H2 may be formed on the strip substrate 101, and a plating process may be performed. The second through-holes H2 may expose at least a portion of each of the plurality of preliminary pads 112Pa' from the preliminary surface protective layer 113p. For example, the strip substrate 101 may be immersed in a plating bath containing metal ions, and a voltage may be applied to the plating bar 103. Accordingly, a voltage may be applied to each of the plurality of preliminary pads 112Pa' through the plurality of first plating lines 112DL1 and the plurality of second plating lines 112DL2 shorted to the plating bar 103, and a surface plating layer 112Pb may be formed on the plurality of preliminary pads 112Pa' exposed through the second through-holes H2.

Figure 6C:
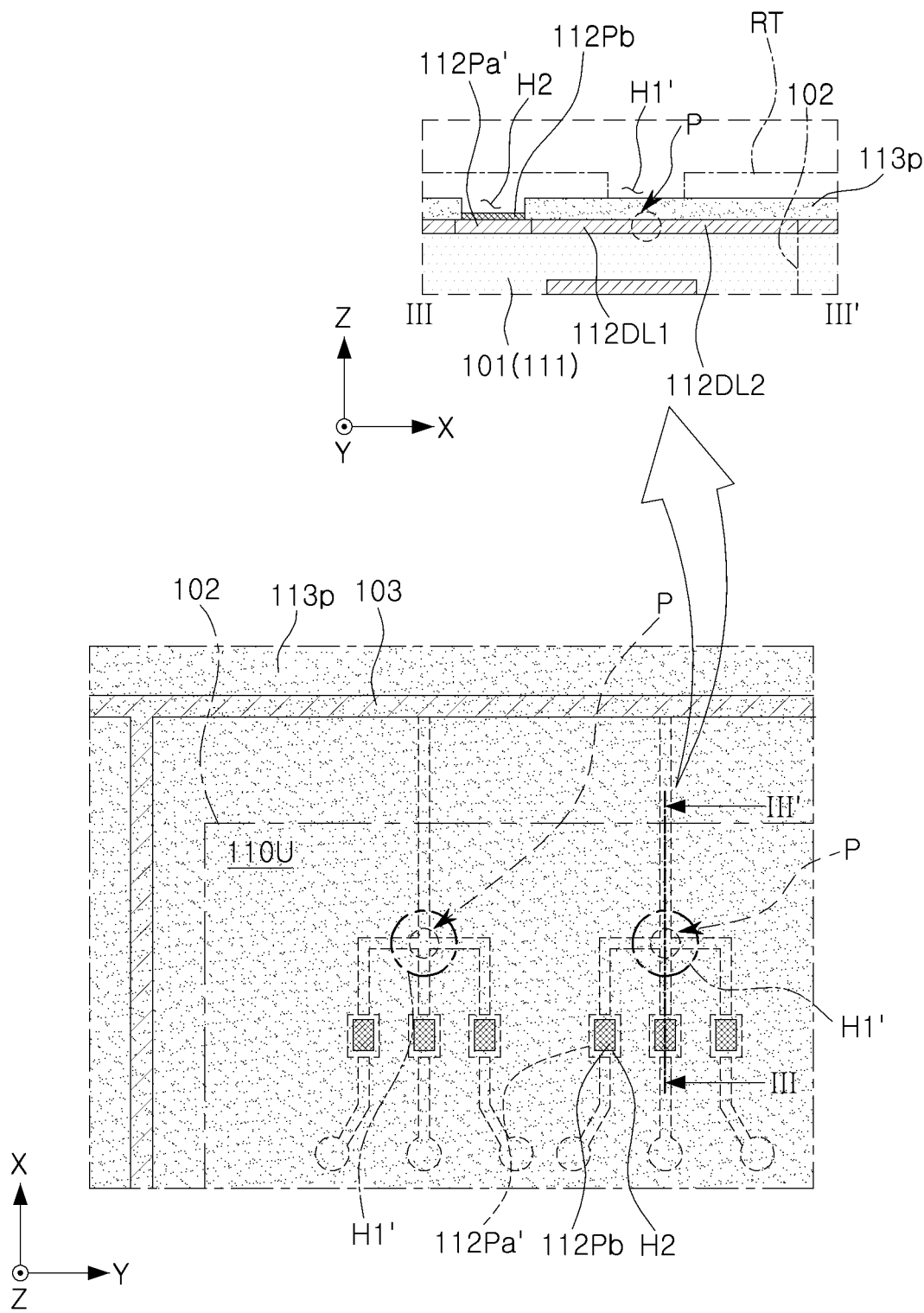

Referring to FIG. 6C, a resist layer RT having first preliminary through-holes H1' may be formed on the preliminary surface protective layer 113p. The first preliminary through-holes H1' may respectively correspond to contact points P of the plurality of first plating lines 112DL1 and the plurality of second plating lines 112DL2. The first preliminary through-holes H1' may be formed to have a predetermined area and shape to prevent interference between the plurality of first plating lines 112DL1 and the plurality of second plating lines 112DL2 separated after an etch-back process is performed. The resist layer RT may be a photoresist layer including a photosensitive material.

Figure 6D:
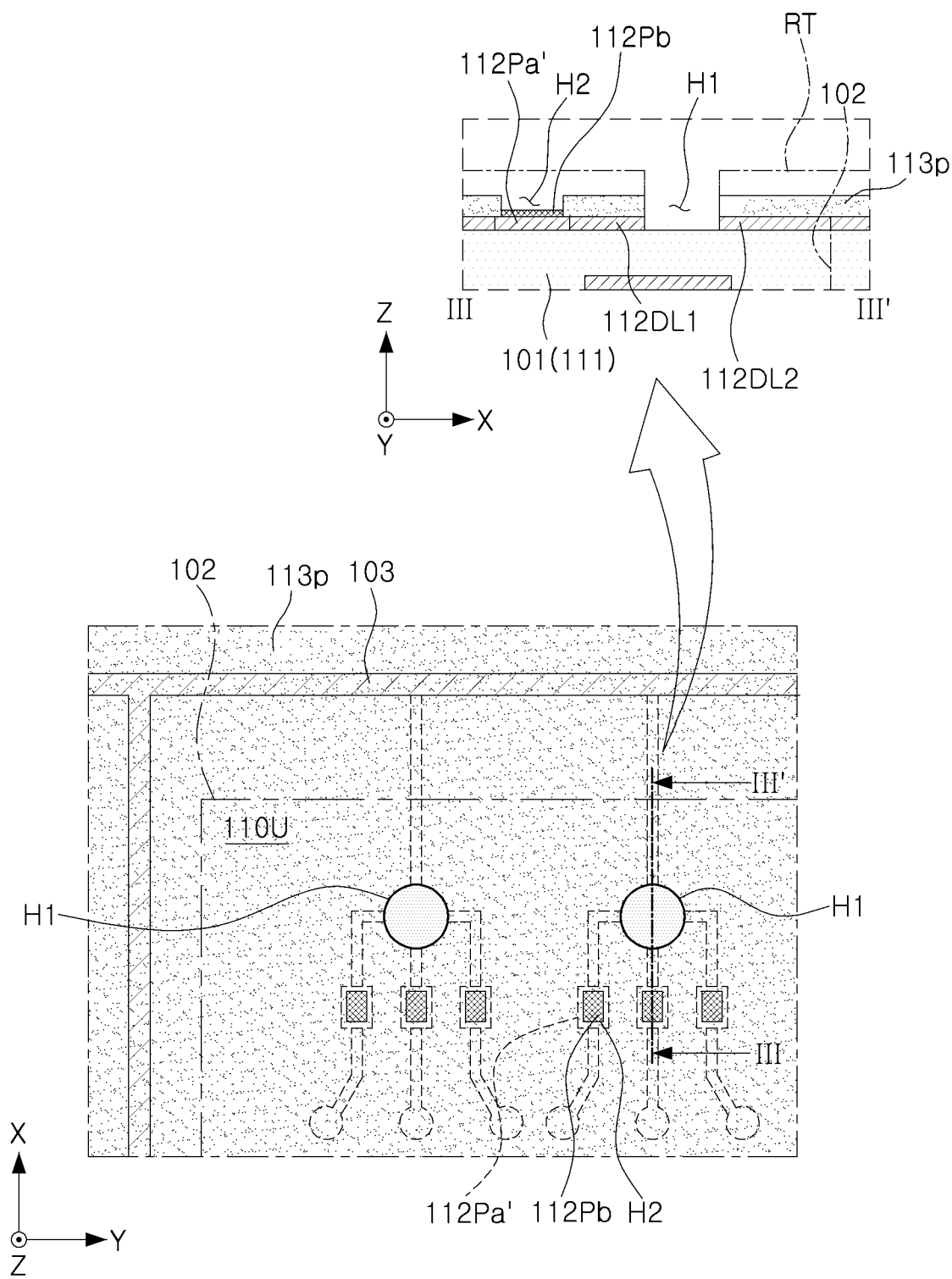

Referring to FIG. 6D, first through-holes H1 for cutting the plurality of first plating lines 112DL1 and the plurality of second plating lines 112DL2 may be formed. The first through-holes H1 may be formed by an etching process using the resist layer RT. For example, the preliminary surface protective layer 113p exposed through the first preliminary through-holes H1', and a portion of each of the plurality of first plating lines 112DL1 and the plurality of second plating lines 112DL2 shorted from the contact points P may be sequentially etched. Accordingly, the plurality of first plating lines 112DL1 and the plurality of second plating lines 112DL2 may be physically spaced apart from each other in the first through-holes H1. The plurality of first plating lines 112DL1 and the plurality of second plating lines 112DL2 may correspond to the plurality of first dummy patterns 112D1 and the plurality of second dummy patterns 112D2 of FIG. 2A. Thereafter, by separating the unit substrate 110U along the substrate outline 102, the plating bar 103 and the plurality of second plating lines 112DL2 may be separated.

As set forth above, according to example embodiments of the present inventive concept, a semiconductor package may be provided in which a degree of freedom of an interconnection pattern is improved by minimizing a removing region of a plating line for surface treatment.

While example embodiments have been shown and described above, it will be apparent to those skilled in the art that modifications and variations could be made without departing from the scope of the present inventive concept as defined by the appended claims.

What is claimed is:

1. A semiconductor package, comprising:
   a substrate including an insulating layer, a plurality of pads on the insulating layer, a surface protective layer covering the insulating layer and having first through-holes exposing at least a portion of the insulating layer and second through-holes exposing at least a portion of each of the plurality of pads, a plurality of first dummy patterns extending from the plurality of pads to the first through-holes, and a plurality of second dummy patterns extending from the first through-holes to an edge of the insulating layer;
   a semiconductor chip on the substrate and including connection terminals electrically connected to the plurality of pads exposed through the second through-holes; and
   an encapsulant encapsulating at least a portion of the semiconductor chip and filling the first through-holes,
   wherein a separation distance between adjacent ones of the first through-holes is greater than a separation distance between adjacent ones of the second through-holes.

2. The semiconductor package of claim 1, wherein, in each of the first through-holes, the plurality of first dummy patterns and the plurality of second dummy patterns are in contact with the encapsulant.

3. The semiconductor package of claim 1, wherein each of the first through-holes is located at a point at which extension lines of each of two or more first dummy patterns of the plurality of first dummy patterns and one second dummy pattern of the plurality of second dummy patterns intersect each other,
   wherein the two or more first dummy patterns and the one second dummy pattern are spaced apart from each other in the first through-holes.

4. The semiconductor package of claim 3, wherein a separation distance between the two or more first dummy patterns and the one second dummy pattern is about 100 μm or more.

5. The semiconductor package of claim 3, wherein the two or more first dummy patterns and the one second dummy pattern are electrically insulated from each other.

6. The semiconductor package of claim 1, wherein the plurality of pads comprise a body layer and a surface plating layer.

7. The semiconductor package of claim 6, wherein the body layer comprises copper (Cu) or an alloy including copper (Cu),
   wherein the surface plating layer comprises at least one of tin (Sn), lead (Pb), nickel (Ni), and gold (Au).

8. The semiconductor package of claim 1, wherein, in plan view, the first through-holes have a circular or polygonal shape.

9. The semiconductor package of claim 8, wherein the polygonal shape has sides of substantially equal length.

10. The semiconductor package of claim 1, wherein the first through-holes are disposed closer to a side surface of the substrate than the second through-holes.

11. The semiconductor package of claim 10, wherein the plurality of second dummy patterns include one end exposed to the side surface of the substrate.

12. The semiconductor package of claim 1, wherein the substrate further comprises at least one interconnection pattern extending from at least one of the plurality of pads, wherein the at least one interconnection pattern is positioned between adjacent ones of the first through-holes.

13. The semiconductor package of claim 1, further comprising
connection bumps below the substrate and electrically connected to the plurality of pads.

14. The semiconductor package of claim 1, further comprising
connection members electrically connecting the connection terminals of the semiconductor chip and the plurality of pads.

15. The semiconductor package of claim 14, wherein the connection members comprise a conductive wire or a conductive bump.

16. A semiconductor package, comprising:
a substrate including a plurality of pads, a surface protective layer having first through-holes and second through-holes spaced apart from the first through-holes and exposing at least a portion of each of the plurality of pads, a plurality of first dummy patterns extending from the plurality of pads to one side of the first through-holes, the plurality of first dummy patterns including first cut surfaces adjacent a sidewall of each of the first through-holes, and a plurality of second dummy patterns extending from another side of the first through-holes, the plurality of second dummy patterns having second cut surfaces adjacent the sidewall of each of the first through-holes;
a semiconductor chip on the substrate and including connection terminals electrically connected to the plurality of pads exposed through the second through-holes; and
connection bumps below the substrate and electrically connected to the plurality of pads,
wherein, in the sidewall of each of the first through-holes, a number of first cut surfaces is greater than a number of second cut surfaces.

17. The semiconductor package of claim 16, wherein in the sidewall of each of the first through-holes, the number of the first cut surfaces is two or more, and the number of second cut surfaces is one.

18. The semiconductor package of claim 16, wherein the plurality of second dummy patterns extend to an edge of the substrate.

19. A semiconductor package, comprising:
a substrate including a plurality of pads, a surface protective layer having first through-holes and second through-holes spaced apart from the first through-holes and exposing at least a portion of each of the plurality of pads, a plurality of first dummy patterns extending from one side of the plurality of pads to a first side of the first through-holes, at least one interconnection pattern extending from at least a portion of the plurality of pads between adjacent ones of the first through-holes, and a plurality of second dummy patterns extending from a second side of the first through-holes; and
a semiconductor chip on the substrate and including connection terminals electrically connected to the plurality of pads exposed through the second through-holes.

20. The semiconductor package of claim 19, wherein the plurality of pads are positioned adjacent an edge of the semiconductor chip,
wherein the first through-holes are positioned between the plurality of pads and an edge of the substrate.

* * * * *